(12) United States Patent
Mizuno

(10) Patent No.: US 6,974,960 B2
(45) Date of Patent: Dec. 13, 2005

(54) EXPOSURE SYSTEM AND EXPOSURE METHOD

(75) Inventor: Shinichi Mizuno, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/888,468

(22) Filed: Jul. 9, 2004

(65) Prior Publication Data

US 2005/0116185 A1 Jun. 2, 2005

(51) Int. Cl.$^7$ .............................................. H01J 37/08
(52) U.S. Cl. ................................................ 250/492.22
(58) Field of Search ...................... 250/492.22, 492.23, 250/398

(56) References Cited

U.S. PATENT DOCUMENTS 6,717,157 B2 * 4/2004 Utsumi .................... 250/491.1

* cited by examiner

*Primary Examiner*—Kiet T. Nguyen
(74) *Attorney, Agent, or Firm*—Sonnenschein, Nath & Rosenthal LLP

(57) ABSTRACT

An exposure system and exposure method able to obtain a transfer pattern matching to a high precision an offset of an underlying pattern of an exposed member and improving an overlay accuracy of the underlying pattern and transfer pattern. The system and method swing an electron beam back and forth for periodically repeated forward direction correction and reverse direction correction for distortion of an underlying pattern, where "forward direction correction" means making a position over the offset of the underlying pattern an electron beam target position and "reverse direction correction" means making a position not reaching the offset of the underlying pattern the electron beam target position. Electron beam sub-deflection correction is performed to control an incidence angle of the electron beam to a mask so as to be irradiated at these positions. The desired transfer pattern is obtained by overlaying exposure by the forward direction correction and exposure by the reverse direction correction.

11 Claims, 12 Drawing Sheets

EXPOSURE SYSTEM AND EXPOSURE METHOD

RELATED APPLICATION DATA

The present application claims priority to Japanese Application(s) No(s). P2003-194460 filed Jul. 9, 2003, and P2004-020202 filed Jan. 28, 2004, which application(s) is/are incorporated herein by reference to the extent permitted by law.

BACKGROUND OF THE INVENTION

1. Field of the Invention

The present invention relates to an exposure system and an exposure method, more particularly to an exposure system and exposure method controlling an incidence angle of charged particles to a mask arranged facing a wafer to correct a position of a transfer patter in accordance with distortion of an underlying pattern of the wafer.

2. Description of the Related Art

Japanese Unexamined Patent Publication (Kokai) No. 11-135423 discloses low energy electron beam proximity projection lithography (LEEPL), which brings a stencil mask into proximity with a wafer for exposure, using an electron beam sub deflection function to control the direction of an electron beam (EB) to correct offset between a pattern of the mask and an underlying pattern on the wafer.

Japanese Unexamined Patent Publication (Kokai) No. 2003-59819 discloses complementary exposure enabling exposure of a donut shaped pattern or a leaf pattern by a stencil mask by dividing that pattern of the mask into two or more parts. To perform complementary exposure efficiently, the complementary patterns are formed adjacent to each other on the mask and exposed at one time.

If an underlying pattern of a wafer has drastic distortion at an area narrower than the EB diameter, when correcting distortion between the underlying pattern and a transfer pattern by electron beam sub-deflection, a low pass filter effect caused by the electron beam intensity distribution causes insufficient correction and residual distortions. Such drastic distortion occurs due to the magnification, rotation, or offset of the center of gravity of the chip and has to be corrected by electron beam sub-deflection. In complementary exposure, insufficient correction is caused by the electron beam being simultaneously focused on the chips at the two sides of a strut.

For decreasing the residual distortion remaining even with the electron beam sub-deflection function, it is effect to make the EB diameter smaller. However, due to following reasons, the EB diameter is difficult to make smaller.

LEEPL uses as a current source a cathode formed by $LaB_6$. The electrons emitted from the cathode radiate from points on the surface of the cathode with a spreading angle. If the amount of current emitted from a unit area of the surface of the cathode to a unit solid angle is defined as the luminance, the electron beam optical system emitting the electron beam to the mask is maintained at a constant luminance if ignoring Coulomb interaction. Therefore, since the luminance is not increased due to Coulomb interaction, if focusing the electron beam finely, the convergence angle of the electron beam is increased.

However, if the electron beam convergence angle increases, the resolution of a transfer pattern drops. On the other hand, if maintaining the resolution constant and making the electron beam smaller in diameter, the amount of current drops. The exposure time is an important factor determining LEEPL performance. If the electron beam is made low in current, the exposure time becomes longer, so becomes a primary factor behind the drop in throughput. Further, the luminance of a cathode is limited by its material, so making the cathode higher in luminance so as to make up for amount of current and maintain resolution is difficult.

The above discussion concerned the theoretical limits. However, even within the theoretical limits, for maintaining the resolution and the exposure time while making the EB diameter smaller, the electron beam optical system has to be made higher in performance, so the cost increases. If making the cathode larger in size and larger in current to shorten the exposure time and improve the throughput of the exposure system, the EB diameter ends up becoming large due to the unchanging luminance. Therefore, there are limits to the reduction of the EB diameter.

SUMMARY OF THE INVENTION

An object of the present invention is to provide an exposure system and exposure method able to obtain a transfer pattern matching with a high precision the distortion of an underlying pattern of an exposed member and able to improve an overlay accuracy of the underlying pattern and the transfer pattern.

To achieve the above object, according to a first aspect of the present invention, there is provided an exposure system having a mask arranged at a position facing to an exposed member having an underlying pattern and formed with a pattern to be transferred to the exposed member, a charged particle beam scanning means for scanning the mask by a charged particle beam, and an incidence angle controlling means for controlling an incidence angle of the charged particle beam to the mask so as to make forward direction correction and reverse direction correction of the position of the transfer pattern with respect to distortion of the underlying pattern.

In the exposure system of the present invention, the charged particle beam used for the scanning by the charged particle beam scanning means is controlled in its incidence angle to the mask by the incidence angle controlling means and irradiated to the exposed member. The incidence angle controlling means controls the incidence angle of the charged particle beam to make forward direction correction and reverse direction correction for the distortion of an underlying pattern of the exposed member the required number of times. Note that, in the present invention, "forward direction correction" means making a position over the distortion (offset) of the underlying pattern the electron beam target position, while "reverse direction correction" means making a position not reaching the offset of the underlying pattern the electron beam target position. Due to this, latent images to the exposed member are overlaid in the forward direction correction and the reverse direction correction and, as a result, a transfer pattern distorted to match with the distortion of its underlying pattern can be obtained.

According to a second aspect of the present invention, there is provided an exposure method for arranging a mask facing an exposed member having an underlying pattern and forming a transfer pattern on the exposed member by a charged particle beam passing an aperture pattern formed in the mask, comprising a step of scanning the mask by the charged particle beam controlled an incidence angle of that to the mask so as to make forward direction correction and reverse direction correction of the position of the transfer pattern and forming the transfer pattern at the exposed member.

In the exposure method of the present invention, the incidence angle of the charged particle beam is controlled so as to make forward direction correction and reverse direction correction for distortion of the underlying pattern caused by the warping of the exposed member. Due to this, latent images to the exposed member are overlaid in the forward direction correction and the reverse direction correction and, as a result, a transfer pattern distorted to match with the distortion of its underlying pattern can be obtained.

BRIEF DESCRIPTION OF THE DRAWINGS

These and other objects and features of the present invention will be described in more detail with reference to the accompanying drawings, in which:

FIG. 4A is a graph for explaining characteristics of electron beam sub-deflection correction, while

DESCRIPTION OF THE PREFERRED EMBODIMENTS

Hereinafter, preferred embodiments of an exposure system and exposure method of the present invention will be explained with reference to the attached drawings.

First Embodiment

Figure 1:
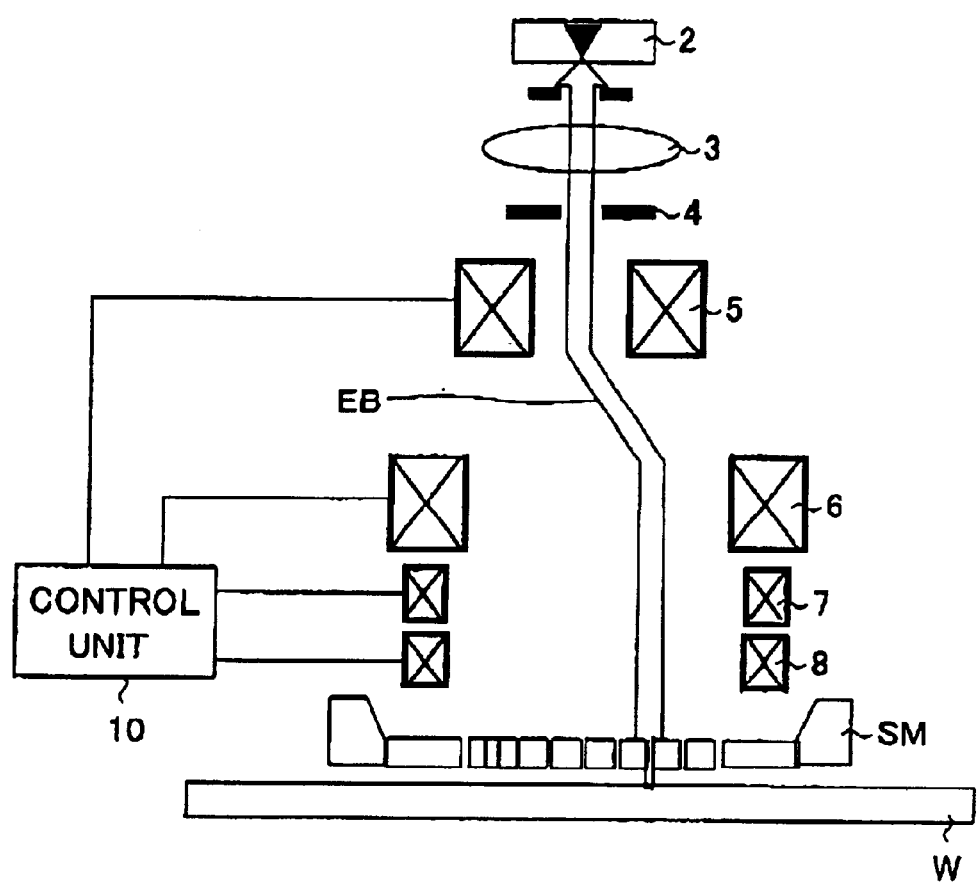
FIG. 1 is a view of the general configuration of an exposure system according to an embodiment of the present invention.

FIG. 1 is a view of the general configuration of an exposure system according to a first embodiment of the present invention. An exposure system shown in FIG. 1 is an equal magnification proximity exposure system using a low acceleration voltage electron beam.

The exposure system has an electron gun 2 for emitting an electron beam EB, a condenser lens 3 for making the electron beam EB parallel, an aperture 4 for restricting the electron beam EB, a pair of main deflectors 5 and 6 for deflecting the electron beam EB so that it strikes a stencil mask SM perpendicularly in a raster or vector scan mode while remaining parallel, and a pair of sub-deflectors 7 and 8 for deflecting the electron beam so as to adjust an incidence angle to the stencil mask.

The main deflectors 5 and 6 and the sub-deflectors 7 and 8 are connected to a control unit 10 outputting a signal for controlling the deflection of the electron beam by the deflectors 5 to 8. Note that while not shown, the control unit 10 is also connected to the electron gun 2 etc. and controls operation of the entire system. The main deflectors 5 and 6 and the control unit 10 correspond to the electron beam scanning means of the present invention, while the sub-deflectors 7 and 8 and the control unit 10 correspond to the incidence angle controlling means of the present invention. The control unit 10 corresponds to a compensation signal generating means of the present invention, while the sub-deflectors 7 to 8 correspond to the deflecting means.

Figure 2A:
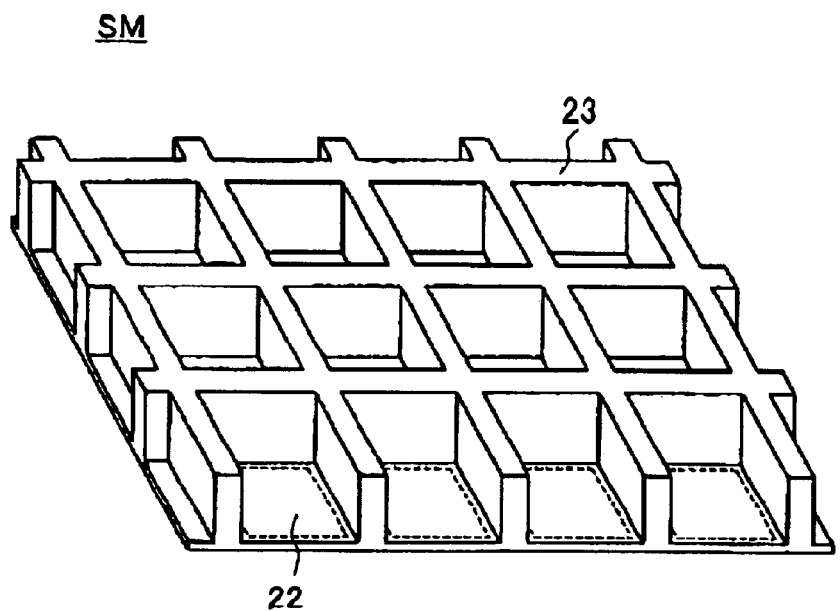
FIG. 2A is a perspective view of an example of a stencil mask.

The exposure system uses low energy electrons, so uses a stencil mask SM formed with patterns comprising apertures. FIG. 2A is a perspective view of an example of the stencil mask, while FIG. 2B is a cross-sectional view of the stencil mask shown in FIG. 2A.

As shown in FIG. 2A, the stencil mask is comprised of an about 10 nm to 10 μm thin film 22 of silicon etc. formed with not shown patterns comprised of apertures and is partitioned by lattice-like struts (beams) 23 for reinforcing the thin film.

Figure 2B:
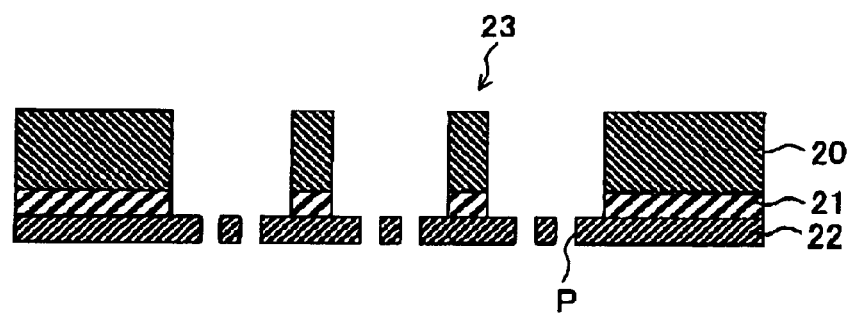
FIG. 2B is a cross-sectional view of the stencil mask shown in FIG. 2A.

As shown in FIG. 2B, the stencil mask is formed for example by an SOI substrate, and, is comprised of a silicon substrate 20, an etching stopper film 21 made of silicon oxide etc., and a thin film 22 formed by an SOI layer. The silicon substrate 20 and the etching stopper film 21 are processed to form the struts 23. The thin film 22 partitioned by the struts 23 is formed with patterns P comprising apertures. Note that the stencil mask is not limited in its material and may be formed without utilizing an SOI substrate.

Figure 3:
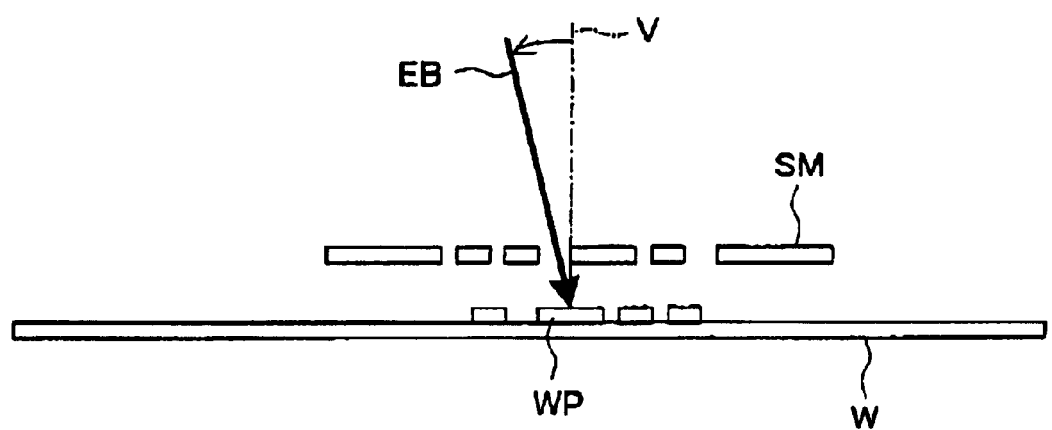
FIG. 3 is a view for explaining electron beam sub-deflection correction.

FIG. 3 is a view for explaining an exposure operation using the above exposure system. Note that the struts of the stencil mask are not shown in FIG. 3 is.

Electron beam EB passing through an aperture of the stencil mask SM exposes a not shown resist on a wafer W. The exposure system shown in FIG. 1 employs equal magnification exposure, so the stencil mask SM and the wafer W are arranged in proximity.

In exposure, the control unit 10 controls the main deflectors 5 and 6 to scan the stencil mask SM by the electron beam EB so as to transfer patterns of the stencil mask to the wafer W. Further, the control unit 10 outputs a signal for controlling the deflection angle of electron beam to the sub-deflectors 7 and 8. The sub-deflector 7 and 8 tilt the direction of the electron beam EB slightly to a normal V of the mask. Due to this, a transfer pattern is transferred displaced in position (distorted) so as to overlap an underlying pattern WP warped from its accurate position on the wafer W. In the present specification, "correction of distortion" means forming a transfer pattern distorted to match the distortion of its underlying pattern.

In LEEPL alignment, correction of distortion of an underlying pattern caused by system error is indispensable for achieving overlay accuracy. In the related art, as shown in FIG. 3, the electron beam EB was deflected by the electron beam sub-deflection function so that the center of the electron beam passing through the stencil mask SM overlapped the underlying pattern WP formed by a scanner etc.

[Examination of Characteristics of Electron Beam Sub-Deflection Correction]

Figure 4A:
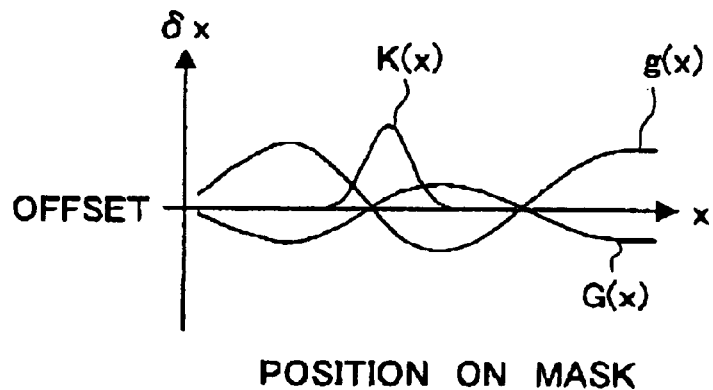

FIG. 4A is a view for explaining characteristics of electron beam sub-deflection correction. The changes in position of a transfer pattern due to a electron beam sub-deflection function were examined in detail. As a result, it was found that distortion G(x) of a transfer pattern after electron beam sub-deflection correction may be expressed by the following equation:

$$G(x)=g(x)*K(x) \tag{1}$$

where, "g(x)" is the offset of the underlying pattern on the wafer with reference to the mask pattern (distortion of the underlying pattern), "K(x)" is the electron beam intensity distribution before passing through the mask, an "*" is convolution. "G(x)" is the offset of the transfer pattern with reference to the mask pattern after exposure (distortion of transfer pattern).

In equation (1), the distortion "G" of the transfer pattern after electron beam sub-deflection correction can be considered the distortion obtained by applying a Fourier transform E of the electron beam intensity distribution K(x) as a filter to the distortion g of the underlying pattern.

Figure 4B:
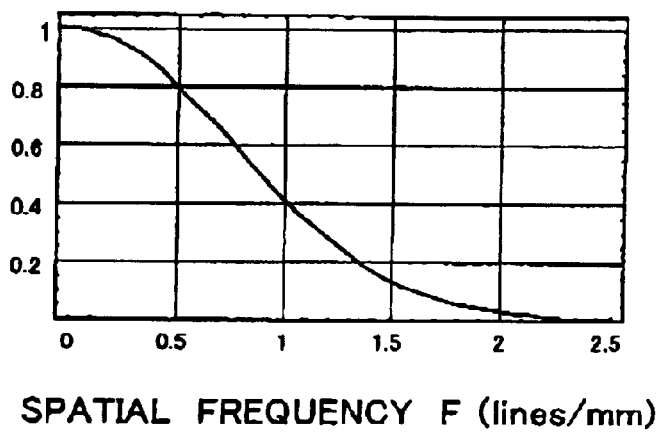
FIG. 4B is a graph of a value E after a Fourier transform of an electron beam intensity distribution K(x)

FIG. 4B is a view showing the value E obtained after a Fourier transform of the electron beam intensity distribution K(x). As clear by applying a Fourier transform to equation (1), the value E indicates the correction efficiency for each frequency of distortion when correcting distortion of an underlying pattern. In FIG. 4B, the "f" of the abscissa corresponds to the spatial frequency of the distortion of the underlying pattern. FIG. 4B shows an example in the case of calculation assuming the electron beam intensity distribution K(x) is a Gaussian distribution of a full width at half maximum of 500 µm.

As shown in FIG. 4B, when using electron beams having the same EB diameter, the larger the spatial frequency f of distortion of an underlying pattern, the smaller the distortion compensation efficiency. Therefore, the value E of the Fourier transform of the electron beam intensity distribution K(x) can be used as a low pass filter.

From equation (1), to obtain a transfer pattern having a distortion accurately matching distortion of an underlying pattern of the wafer by electron beam sub-deflection correction, it is sufficient that the EB diameter be made smaller. However, as explained above, the EB diameter is limited by the current density of the cathode or the cathode material, so if making the EB diameter smaller, the amount of the current falls. Therefore, the throughput falls and the productivity drops. Accordingly, the EB diameter is difficult to make smaller.

In this way, when there is drastic distortion at an underlying pattern on the wafer, if performing sub-deflection correction so that the center of the electron beam overlaps the underlying pattern, the obtained transfer pattern will not accurately match with the underlying pattern and residual distortion G(x)−g(x) will occur. If making the EB diameter smaller, the distortion correction efficiency will rise, but there are limits to the reduction of the EB diameter.

Figure 5A:
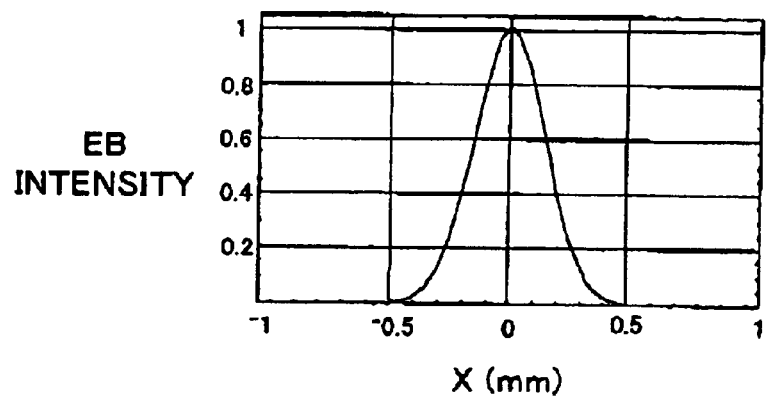
FIG. 5A is a graph showing an example of an electron beam intensity distribution used.
Figure 5B:
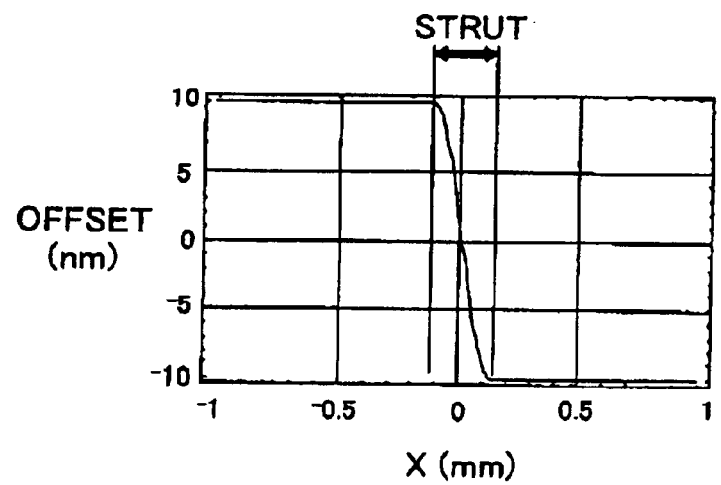
FIG. 5B is a graph of pattern distortion near a chip boundary.
Figure 5C:
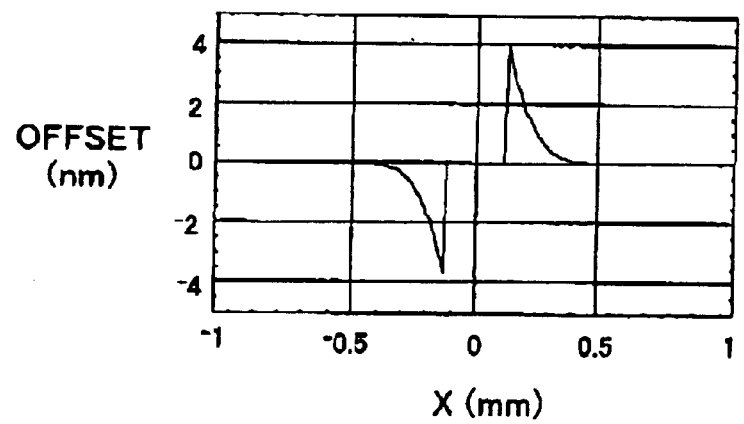
FIG. 5C is a graph of residual distortion after transfer by electron beam sub-deflection correction.

FIGS. 5A, 5B, and 5C are graphs for explaining an example of occurrence of residual distortion in the case of correcting drastic distortion of an underlying pattern by electron beam sub-deflection correction of the related art.

FIG. 5A shows an example of the intensity distribution of the electron beam used, FIG. 5B shows distortion (offset) of an underlying pattern near a chip boundary (corresponding to a strut in a mask), and FIG. 5C shows the residual distortion after transfer by sub-deflection correction.

As shown in FIG. 5A, it is assumed that the electron beam intensity follows a Gaussian distribution and assumed that an electron beam having a full width at half maximum of 350 µm is used. Further, the case of using this electron beam to correct offset (distortion) of ±10 nm at chips adjoining each other across a distance of 250 µm as shown in FIG. 5B is assumed.

When correcting distortion under these conditions, from equation (1), the result is the residual distortion shown in FIG. 5C. The drastic distortion shown in FIG. 5B occurs in magnification, rotation, or offset in the underlying pattern of a chip. As shown in FIG. 5C, it is learned that a 40% residual distortion is present for an pattern offset of ±10 mm. This cannot be neglected.

[Electron Beam Sub-deflection Correction Method According to First Embodiment]

Therefore, the present embodiment generates a compensation signal to be output to the sub deflectors 7 and 8 for correcting an underlying pattern WP on the wafer as follows.

As explained above, the electron beam deflection correction method of the related art cannot completely correct finely fluctuating high frequency components in distortion of an underlying pattern due to a low pass filter effect of the value E after Fourier transform of the electron beam intensity distribution K (serving as the distortion correction efficiency) and residual distortion occurs. Therefore, to reduce the residual distortion after correction, it is sufficient to apply a compensation filter T of equation (2) for canceling out the filter value E to an electron beam deflection signal.

$$T=1/E \tag{2}$$

Here, the "electron beam deflection signal" is a signal of the EB deflection angle in the case of setting a target position so that the center of the electron beam overlays a distorted underlying pattern. The compensation filter T is a reciprocal of the value E at each frequency and increases as the frequency becomes higher. That is, it is a high pass filter. Therefore, it emphasizes offset compensation of a transfer pattern.

The compensation filter T diverges exponentially, so even at a high frequency where it becomes so small that the Fourier transform F(g) of the distortion g of an underlying pattern can be neglected, the value obtained by applying the compensation filter T to F(g) diverges. Therefore, the filtered signal TF(g) also diverges.

For avoiding such divergence, it is necessary to cut off the compensation filter T at a finite frequency region ft (cutoff frequency). However, when making the chip interval (corresponding to the strut width at a mask) Wb and the frequency fb=1/(2Wb), if ft<fb, pattern distortion near the chip boundaries cannot be resolved, so a sufficient compensation effect cannot be obtained. The "fb" substantially matches with the center frequency of a spectrum obtained by applying a Fourier transform to distortion of a transfer pattern. Therefore, it is necessary that Ft>fb. The result of calculation for ft=2fb and ft=1.2fb will be explained next.

(1) Case of Cutoff Frequency ft=2fb

Figure 6A:
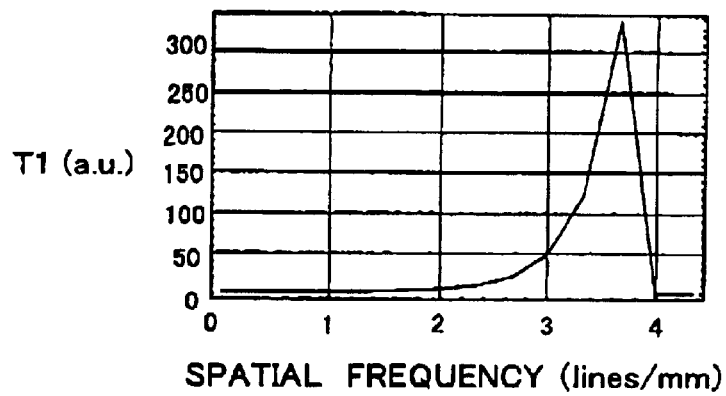
FIG. 6A is a graph of a compensation filter T1 in the case of a cutoff frequency ft=2fb.
Figure 6B:
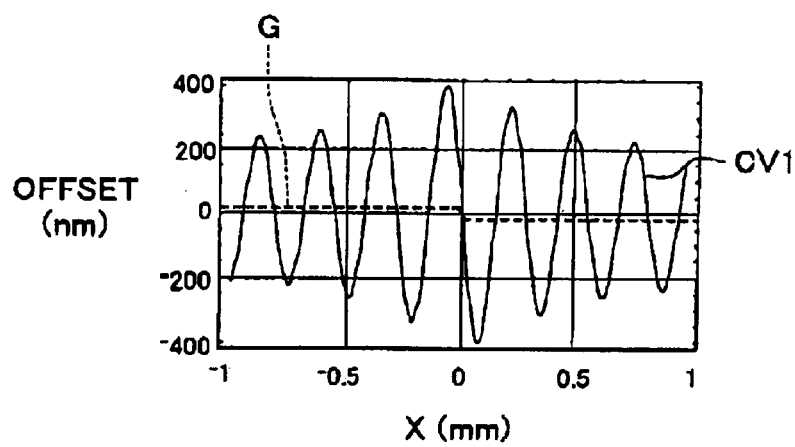
FIG. 6B is a graph of an electron beam correction target position CV1 by a compensation signal produced by application of the compensation filter T1.
Figure 6C:
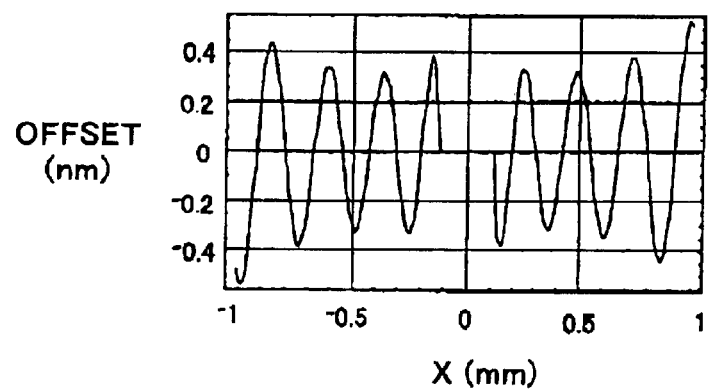
FIG. 6C is a graph of residual distortion comprised of the difference of the distortion between a transfer pattern and an underlying pattern after correction.

FIG. 6A is a graph of the compensation filter T1 in the case of a cutoff frequency ft=2fb, FIG. 6B is a graph of the electron beam correction target position CV1 based on a compensation signal generated by application of the compensation filter T1, while FIG. 6C is a graph of residual distortion comprised of the difference between the transfer pattern and the underlying pattern after correction. Note that "Wb" is 250 μm as an example.

When applying the compensation filter T1 to the deflection signal at a broad frequency area 2fb as shown in FIG. 6A, the residual distortion decreases until around ±0.5 nm as shown in FIG. 6C. However, as shown in FIG. 6B, due to the divergence effect of the compensation filter T1, the amplitude of the compensation signal also diverges. The electron beam correction target position CV1 is the position of irradiation targeted by the electron beam sub-deflection performance and corresponds to the compensation signal. The compensation signal is generated and output by the control unit 10. Further, FIG. 6B also shows the distortion G of an actual transfer pattern exposed by the electron beam correction target position CV1.

FIG. 6B shows that by swinging back and forth the electron beam targeting the electron beam correction target position CV1, the latent images are overlaid and as a result finally the transfer pattern shown by G is obtained. However, the swing of the electron beam is too much larger than the pattern to be resolved, so it is impossible to overlap the images to obtain a transfer pattern in practice. Therefore, the problem arises that resolution of the transfer pattern cannot be obtained.

(2) Case of Cutoff Frequency ft=1.2fb

Figure 7A:
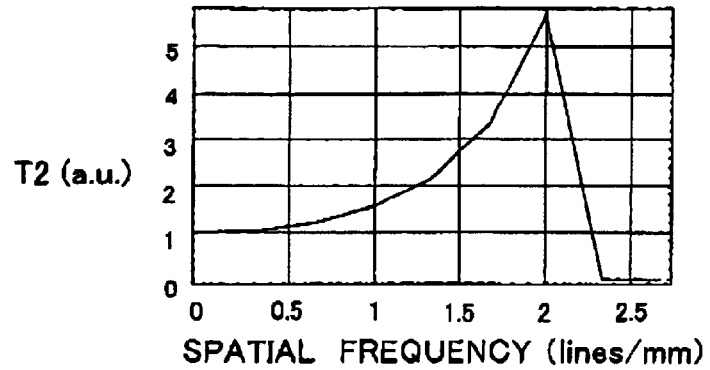
FIG. 7A is a graph of a compensation filter T2 in the case of a cutoff frequency ft=1.2fb.
Figure 7B:
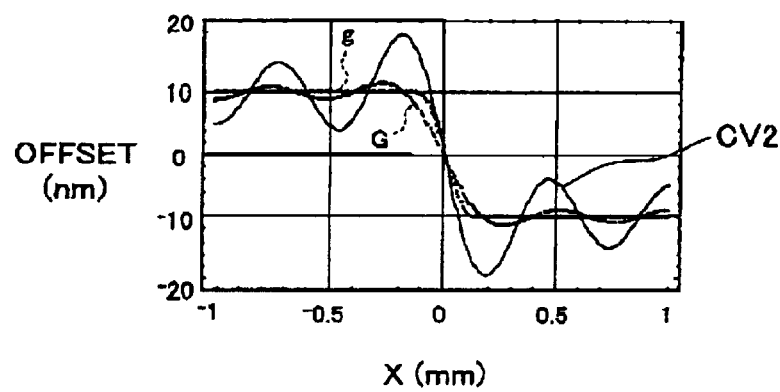
FIG. 7B is a graph of an electron beam correction target position CV2 of a compensation signal obtained by application of the compensation filter T2.
Figure 7C:
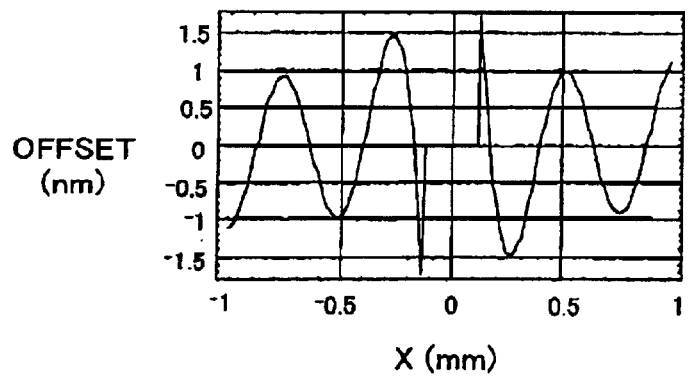
FIG. 7C is a graph of the residual distortion comprised of the difference of the distortion between a transfer pattern and an underlying pattern after correction.

FIG. 7A is a graph showing a compensation filter T2 in the case of the cutoff frequency ft=1.2fb, FIG. 7B is a graph of an electron beam correction target position CV2 based on a compensation signal generated by applying the compensation filter T2, while FIG. 7C is a graph of the residual distortion comprised of the difference between the transfer pattern and the underlying pattern after correction, Note that "Wb" is 250 μm as an example.

When applying the compensation filter T2 to the deflection signal at the frequency region 1.2fb as shown in FIG. 7A, as shown in FIG. 7B, the divergence effect of the compensation filter T2 decreases and the compensation signal for swinging back and forth the electron beam at the electron beam correction target position CV2 becomes about 20 nm or the same extent as the distortion g of the underlying pattern, so the resolution can be maintained. In FIG. 7B, ""G" is the distortion G of an actual transfer pattern exposed by the electron beam correction target position CV2. The residual distortion at that time is around ±1.5 nm as shown in FIG. 7C.

In the above electron beam sub-deflection correction, there is a tradeoff between the residual distortion and resolution. However, the cutoff frequency of the compensation filter T may be adjusted to select the optimal conditions. From the above, the cutoff frequency ft of the compensation filter T has to be larger than "fb". However, if too large, the electron beam correction target position will diverge and the resolution will drop. The most suitable range of the cutoff frequency is as shown in the following equation;

$$fb < ft < ln(\mu/\rho)fb \quad (3)$$

In equation (3), "$\mu$" is the resolution dimension, and "$\sigma$" is the magnitude of offset.

As explained above, in the present embodiment, a compensation filter for canceling out the low pass filter effect of the electron beam intensity distribution (high pass filter) is generated using a Fourier transform. The compensation filter is applied to the electron beam deflection signal to generate a compensation signal.

The compensation signal obtained by the above, as shown in FIG. 7B, makes the electron beam swing back and forth so as to periodically repeat forward direction correction and reverse direction correction for the distortion g of the underlying pattern. "Forward direction correction" means to make a position over the offset of the underlying pattern the electron beam target position, while "reverse direction correction" means to make a position not reaching the offset of the underlying pattern the electron beam target position. Based on the compensation signal output from the control unit 10, the sub deflectors 7 and 8 deflect the electron beam so as to control the incidence angle of the electron beam to the mask. The latent images of the forward direction correction and the latent images of the reverse direction correction can be overlaid to obtain the desired transfer pattern.

Further, as explained with reference to FIG. 7B, the forward direction correction and the reverse direction correction are preferably repeated by a period and amplitude so that overlay of latent images of forward direction correction and latent images of reverse direction correction gives the resolution of the transfer pattern. For obtaining a compensation signal of that period and amplitude, as explained above, the cutoff frequency of the compensation filter T is adjusted.

According to the exposure system and the exposure method of the present embodiment, a transfer pattern having distortion matching with a high precision the distortion of the underlayer pattern of the wafer can be obtained and the overlay accuracy of the underlying pattern and the transfer pattern can be improved. For example, if the full width at half maximum of the electron beam is 350 μm and the strut width is 250 μm, the residual distortion can be reduced to around 1 nm.

Further, even if the EB diameter of the electron beam used becomes enlarged, the residual distortion can be reduced with a high precision, so the electron beam can be made higher in current to enable reduction of the exposure time. Therefore, the throughput of the exposure system can be improved. Note however that to obtain the resolution of the transfer pattern, the EB diameter of the electron beam used is preferably made the same or smaller than the strut width.

The patterns of a semiconductor device produced by using the exposure system and the exposure method according to the present embodiment are characterized in that offsets of the transfer patterns shown by G in FIG. 7B become periodic.

Second Embodiment

In the first embodiment, the compensation signal for correcting distortion of an underlying pattern was obtained by using a Fourier transform. In the second embodiment, a wavelet transform is used.

As shown in equation (1), the distortion G of a corrected transfer pattern is expressed by a convolution of the distortion g of the correction target and the electron beam intensity distribution K. When an m-dimensional vector having as elements target positions $X_i$ (compensation signal) for control of the electron beam deflection angle is "v" and an n-dimensional vector having as elements position $x_i$ of points of the underlying pattern to be corrected is "q", equation (1) may be expressed by a matrix equation as shown by equation (4):

$$q = M \cdot v \tag{4}$$

"M" is an n×m system matrix. Its elements $m_{ij}$ are $m_{ij} = K(x_i - X_j)$ using the normalized intensity distribution K of the electron beam. The order "m" is the number of data points when sampling by a frequency not less than $2f_{max}$ where the maximum frequency of the Fourier spectrum of the electron beam intensity distribution is "$f_{max}$". At that time, it is guaranteed that the electron beam intensity distribution can be accurately reproduced by a sampling theorem. Here, "$f_{max}$" is the frequency where the magnitude of the spectrum becomes small enough to be ignored. The system matrix is a matrix for expressing convolution of equation (1) by a matrix equation.

By finding a "v" satisfying equation (4) (solution of equation (4)), a "v" suitable for correction of the distortion of the underlying pattern (corresponding to compensation signal) is obtained. However, if solving equation (4) as it is, the disadvantage explained below occurs, so in the present embodiment, an approximate solution v" is found using a wavelet transform.

(1) When n>m, in general "v" can be obtained by the least square method, but by using a wavelet transform, the magnitude of the frequency component contained in the approximate solution v" (becoming the compensation signal) can be adjusted. Therefore, a compensation signal suitable for electron beam deflection correction can be obtained. As explained later, a low frequency component near the mother wavelet is extracted and used to obtain a v", suitable for control of the electron beam sub-deflection.

(2) When n=m, "v" is unambiguously determined, bu7t this "v" may not necessarily be suitable for electron beam sub-deflection correction. Therefore, even if residual distortion remains, it is necessary to find the approximate solution v" suitable for electron beam sub-deflection correction. Note that, the residual distortion at the time of electron beam sub-deflection correction using the approximate solution v" has to be in the permissible range. To find this v", a wavelet transform is effective. For the calculation method, as explained later, the same technique as in the above (1) is used.

(3) When n<m, (2) is an unsuitable linear system, so in general "v" is not determined. Therefore, for example, "v" unsuitable for control of electron beam sub-deflection correction, such as including a high frequency component, is included. However, as explained later, by using a technique similar to the case of (1), a v" suitable for control of electron beam sub-deflection correction can be obtained.

In this way, regardless of the magnitude of the order "n" of the input vector and the order "m" of the unknown vector, equation (4) can give an approximate solution v" by the technique explained below using a wavelet transform. Equation (4) is expressed by the following equation (5) by application of a wavelet transform:

$$W_n \cdot q = (W_n \cdot M \cdot W_m^T) \cdot (W_m \cdot v) \tag{5}$$

In equation (5), "$W_m$" and "$W_n$" are wavelet transform matrixes. For the basis functions forming the transform matrixes, Haar basis or other orthogonal basis can be used. "$W_m^T$" expresses a transpose matrix of "$W_m$" and is an inverse matrix "$W_m$".

Here, if expressing the operations of equation (5) by the following equations (6), equation (5) may be expressed by the following equation (7):

$$Q = W_n \cdot q$$

$$Mw = W_n \cdot M \cdot W_m^T$$

$$V = W_m \cdot v \tag{6}$$

$$Q = M_w \cdot V \tag{7}$$

A wavelet transform by nature results in data of the system matrix M being converged near the mother wavelet ($M_{1,1}$) expressing the average information of the data. Therefore, by extracting a square matrix near the mother wavelet of "Mw" after the wavelet transform of the system matrix M, obtaining its inverse matrix, and applying an inverse wavelet transform, an approximate solution vector v" can be obtained.

Figure 8A:
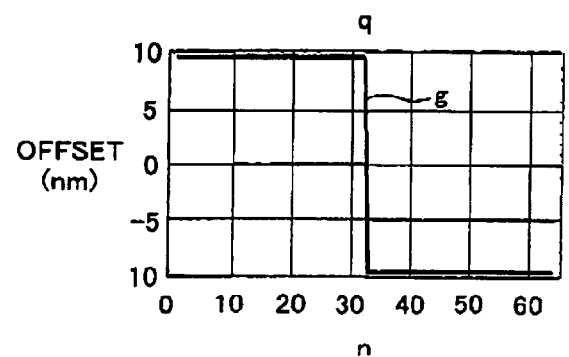
FIG. 8A is a graph of an example of pattern distortion near a chip boundary.

Below, an example will be shown of calculation of distortion compensation for drastic distortion occurring at chip boundaries. FIG. 8A is a graph of distortion near chip boundaries for calculation of distortion compensation and shows a case of offset of ±10 nm at chips adjoining each other across a space of 240 nm. The distortion of the underlying pattern shown in FIG. 8A corresponds to the "q" in equation (4), while the position on the abscissa in FIG. 8B corresponds to the order "n".

Figure 8B:
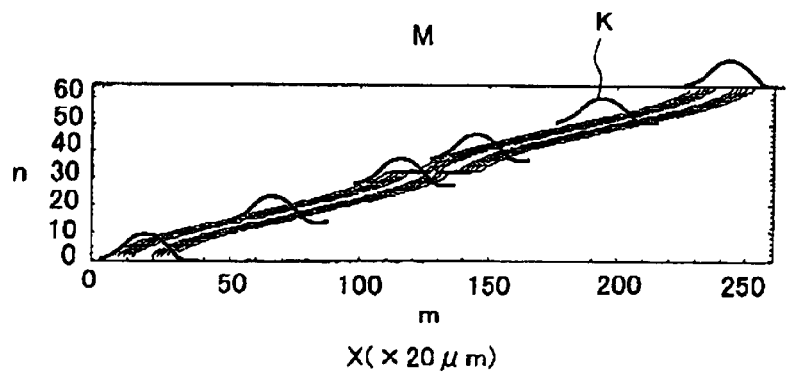
FIG. 8B is view showing by a contour graph a system matrix comprised of the electron beam intensity distribution used for electron beam sub-deflection correction.

The full width at half maximum of the electron beam used for the electron beam sub-deflection correction is assumed to have a Gaussian distribution of 300 μm. FIG. 8B is a contour graph of the system matrix M when the order of the input vector "q" is n=64 and the order of the approximate solution vector v" is m=256. FIG. 8B is shows the electron beam intensity distribution K as well.

Figure 9A:
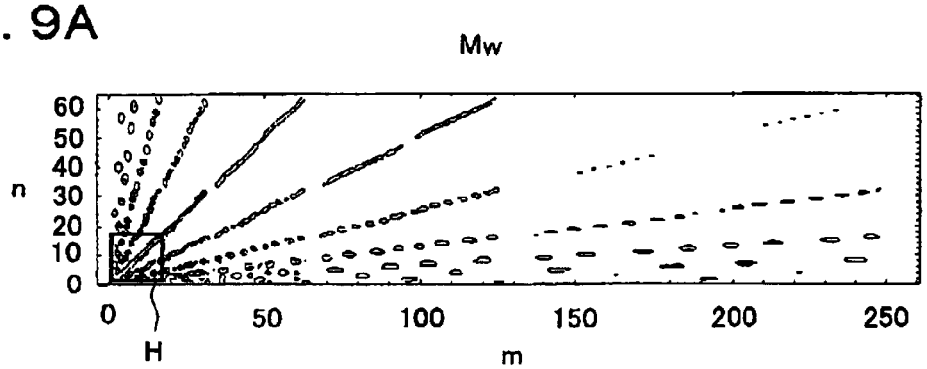
FIG. 9A is a graph of view showing by a contour graph a matrix $M_W$ obtained by applying a two-dimensional wavelet transform to a system matrix M.

FIG. 9A is a contour graph of the matrix $M_w$ obtained by applying a two-dimensional wavelet transform to the system matrix M shown in FIG. 8B. The Haar basis is an orthogonal basis, so can transform data completely similar to a Fourier transform.

Figure 9B:
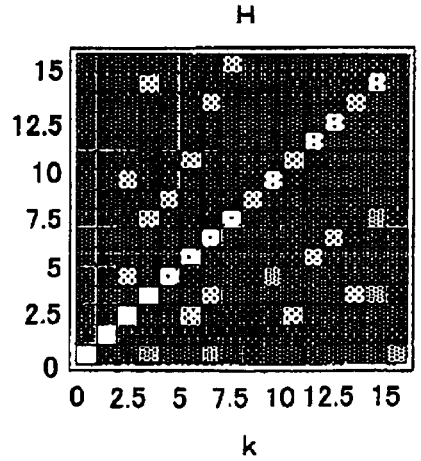
FIG. 9B is a graph showing sizes of elements of a partial matrix H by shades.

A wavelet transform by nature results in data converging at a low level element near the mother wavelet (origin), so the low level element is extracted. FIG. 9B is a view obtained by extracting a 16×16 partial matrix H shown by the square frame in FIG. 9A and expresses the magnitudes of the elements of the partial matrix H by shading.

Figure 10A:
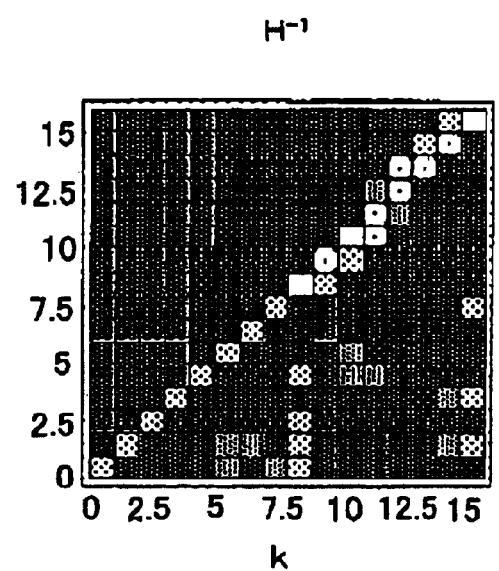
FIG. 10A is a graph showing sizes of elements of an inverse matrix $H^{-1}$ of the partial matrix H by shading.
Figure 10B:
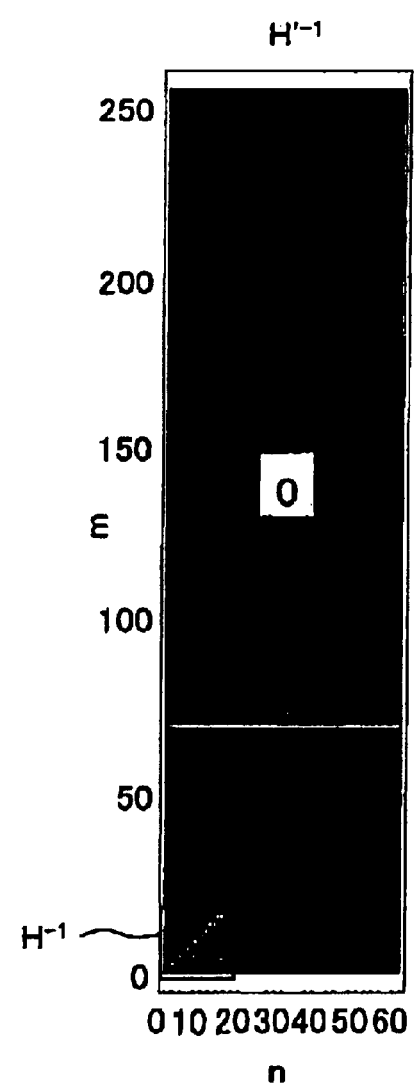
FIG. 10B is a graph showing sizes of elements of an approximate inverse matrix $M'^{-1}$ of "$M_W$" by shading.

FIG. 10A is a graph obtained by finding an inverse matrix $H^{-1}$ of the partial matrix H shown in FIG. 9B and expressing the magnitudes of the elements of the inverse matrix $H^{-1}$ by shading. The 16×16 inverse matrix $H^{-1}$ is given an 0 element at its outside to make the 256×64 matrix shown in FIG. 10B and thereby generate an approximate inverse matrix $H'^{-1}$ of $M_w$.

By applying the approximate inverse matrix $H'^{-1}$ from the left side of equation (7), the following equation (8) stands:

$$H'^{-1} \cdot Q = V \tag{8}$$

Equation (8) may be rewritten using equations (6) to obtain the following equation (9):

$$H'^{-1} \cdot (W_n \cdot q) = W_m \cdot v \tag{9}$$

If applying wavelet transforms to the two sides of equation (9), the following equation (10) is obtained:

$$(W_m^T \cdot H'^{-1} \cdot W_n) \cdot q = v \tag{10}$$

Therefore, comparing equation (4) and equation (10), the approximate inverse matrix $M_{inv}$ of the system matrix M is expressed by the following equation (11). As shown in equation (11), "$M_{inv}$" is given by a two-dimensional wavelet transform of "$H'_{-1}$".

$$M_{inv} = W_m^T \cdot H'^{-1} \cdot W_n \quad (11)$$

Figure 11:
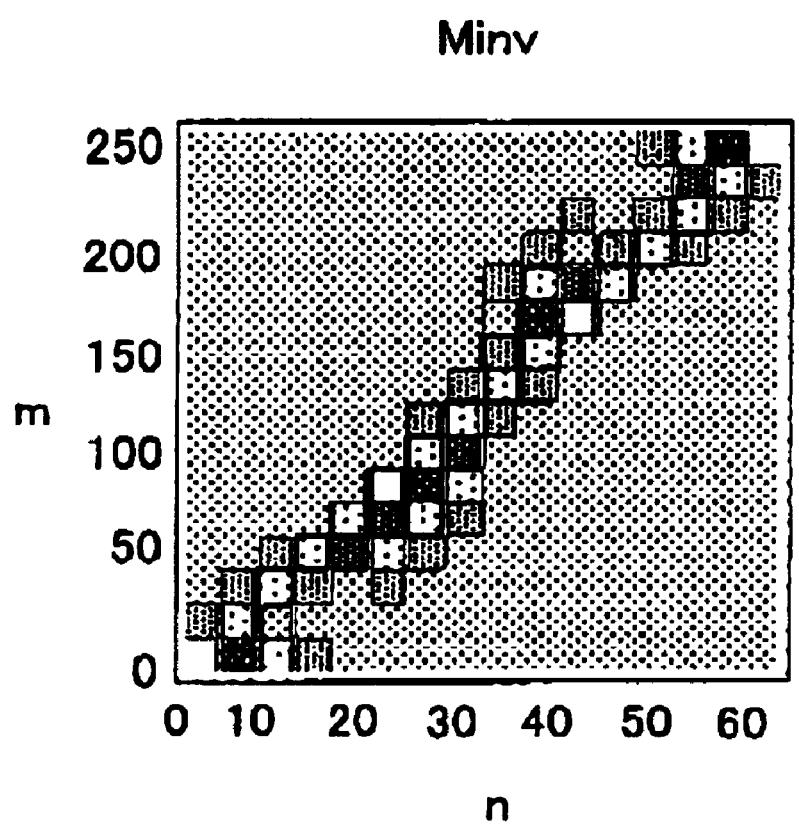
FIG. 11 is a graph showing sizes of elements of an approximate inverse matrix $M_{inv}$ of "M"

FIG. 11 is a graph expressing the magnitudes of the elements of the approximate inverse matrix $M_{inv}$ shown in equation (11) by shading. Summarizing the above, an approximate solution vector v" (which shows the electron beam correction target position and corresponds to the compensation signal) is calculated by the following equation (12):

$$v'' = M_{inv} \cdot q \quad (12)$$

Figure 12A:
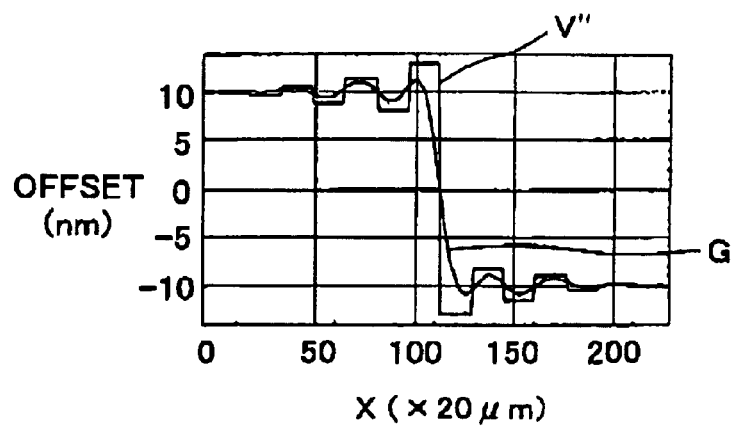
FIG. 12A is a graph showing a distortion G of a transfer pattern predicted for electron beam sub-deflection correction using a compensation signal v"
Figure 12B:
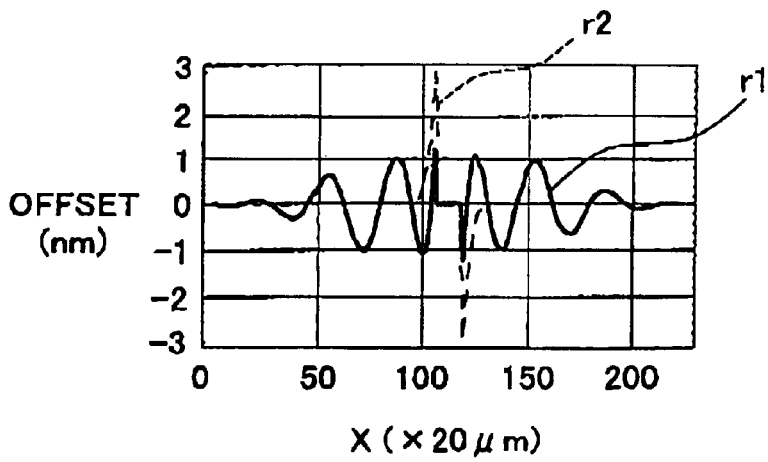
FIG. 12B is a graph of results of calculation of residual distortion G−g=r for the case of electron beam sub-deflection correction using the compensation signal v" and the case of electron beam sub-deflection correction of the related art.

FIG. 12A is a graph of the distortion G of a transfer pattern predicted at the time of electron beam sub-deflection correction using the compensation signal v" given by equation (12). FIG. 12B is a graph of the result of calculation of the residual distortion G−g=r in the case electron beam sub-deflection correction using the compensation signal v" and in the case of electron beam sub-deflection correction of the related art. In this figure, "r1" is the residual distortion after electron beam sub-deflection correction according to the present embodiment, and "r2" is the residual distortion after electron beam sub-deflection correction of the related art.

As shown in FIG. 12B, a residual distortion of 3 nm occurs at the chip boundaries in the related art, but the residual distortion can be suppressed to ±1 nm in the electron beam scan method according to the present embodiment. Therefore, the overlay accuracy between the underlying pattern and the transfer pattern can be improved.

Further, as shown in FIGS. 12A and 12B, the correction target position v" and the residual distortion do not diverge at the two ends of a calculation area. That is, with the method of generating a compensation signal using a wavelet transform, the signal converges at positions away from the drastic distortion, so is suited for actual electron beam sub-deflection correction.

The compensation signal generated using the Fourier transform explained in the first embodiment covers not only the vicinity the drastic distortion, but also the entire region. On the other hand, the compensation signal generated using a wavelet transform is localized at only drastic distortion. That is, a Fourier transform transforms all positional coordinates to frequency, so positional data is lost. On the other hand, a wavelet transform transforms spanning both position and frequency, so no positional data is lost.

Summarizing the effects of the present invention, a transfer pattern matching with a high precision the distortion of the underlying pattern of an exposed member can be obtained, and the overlay accuracy between the underlying pattern and the transfer pattern can be improved.

The present invention is not limited to the method such as the first embodiment in which a compensation filter prepared using a Fourier transform is applied to the electron beam deflection signal to obtain a compensation signal or the method such as the second embodiment in which wavelet transform is used to obtain a compensation signal suitable for control. In the final analysis, it is not particularly limited so long as a transfer pattern reduced in distortion due to repeated forward direction correction and reverse direction correction and overlay of latent images can be obtained. Further, the EB diameter of the electron beam is not limited. In addition, any charged particle beam other than an electron beam, such as ion beam, can also be used.

While the invention has been described with reference to specific embodiments chosen for purpose of illustration, it should be apparent that numerous modifications could be made thereto by those skilled in the art without departing from the basic concept and scope of the invention.

What is claimed is:

1. An exposure system comprising:
    a mask arranged at a position facing to an exposed member having an underlying pattern and formed with a pattern to be transferred to the exposed member,
    a charged particle beam scanning means for scanning the mask by a charged particle beam, and
    an incidence angle controlling means for controlling an incidence angle of the charged particle beam to the mask so as to make forward direction correction and reverse direction correction of the position of the transfer pattern with respect to distortion of the underlying pattern.

2. An exposure system as set forth in claim 1, wherein said incidence angle controlling means controls the incidence angle of said charged particle beam to said mask so as to repeat said forward direction correction and said reverse direction correction at a frequency and amplitude able to obtained resolution of said transfer pattern.

3. An exposure system as set forth in claim 1, wherein
    said mask has struts forming areas where said exposed member is not exposed, and
    said charged particle beam scanning means scans said mask by a charged particle beam having a diameter smaller not more than a width of said struts.

4. An exposure system as set forth in claim 1, wherein said incidence angle controlling means controls the incidence angle of said charged particle beam to said mask for distortion of an underlying pattern occurring at an area smaller than the diameter of said charged particle beam.

5. An exposure system as set forth in claim 1, wherein said incidence angle controlling means comprises:
    a compensation signal generating means for applying a compensation filter to a deflection signal for correcting distortion of said underlying pattern as it is to generate a compensation signal, said compensation filter corresponding to a reciprocal of the value found by applying a Fourier transform to an electron beam intensity distribution and
    a deflecting means for deflecting said charged particle beam according to said generated compensation signal to control said incidence angle.

6. An exposure system as set forth in claim 5, wherein said compensation signal generating means applies said compensation filter cut off in a finite frequency area to said deflection signal to generate said compensation signal so as to suppress divergence of said compensation signal.

7. An exposure system as set forth in claim 1, wherein said incidence angle controlling means comprises:
    a compensation signal generating means for generating a compensation signal based on an approximate inverse matrix of a system matrix and distortion of said underlying pattern, said approximate inverse matrix based on a low frequency component extracted by a wavelet transform of said system matrix expressed using electron beam intensity distribution, and
    a deflecting means for deflecting said charged particle beam according to said generated compensation signal to control said incidence angle.

8. An exposure method for arranging a mask facing an exposed member having an underlying pattern and forming a transfer pattern on the exposed member by a charged particle beam passing an aperture pattern formed in the mask, comprising a step of scanning the mask by the charged particle beam controlled an incidence angle of that to the mask so as to make forward direction correction and reverse direction correction of the position of the transfer pattern and forming the transfer pattern at the exposed member.

9. An exposure method as set forth in claim 8, wherein the incidence angle of said charged particle beam to said mask is controlled so as to repeat said forward direction correction and said reverse direction correction at a frequency and amplitude able to obtain resolution of said transfer pattern.

10. An exposure method as set forth in claim 8, wherein said mask has struts where said exposed member is not exposed and is scanned by said charged particle beam having a diameter not more than a width of said struts.

11. An exposure method as set forth in claim 8, wherein said incidence angle of said charged particle beam to said mask is controlled so as to make forward direction correction and reverse direction correction to distortion of said underlying pattern occurring at an area smaller than the diameter of said charged particle beam.

* * * * *